US 6,642,503 B2
(12) United States Patent
Kummaraguntla et al.

(10) Patent No.: US 6,642,503 B2
(45) Date of Patent: Nov. 4, 2003

(54) TIME DOMAIN SENSING TECHNIQUE AND SYSTEM ARCHITECTURE FOR IMAGE SENSOR

(75) Inventors: Ravi K. Kummaraguntla, Jamestown, NC (US); Zhiliang Julian Chen, Plano, TX (US); John G. Harris, Gainesville, FL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/064,132

(22) Filed: Jun. 13, 2002

(65) Prior Publication Data

US 2003/0001080 A1 Jan. 2, 2003

Related U.S. Application Data

(60) Provisional application No. 60/298,051, filed on Jun. 13, 2001.

(51) Int. Cl.$^7$ .............................................. H01L 31/00
(52) U.S. Cl. .............................. 250/214.1; 250/214 P; 250/214 R
(58) Field of Search .................... 250/214.1, 214 R, 250/214 P, 208.1; 369/63–69, 215; 257/290–292; 348/294, 295, 297; 327/514, 515

(56) References Cited

U.S. PATENT DOCUMENTS

| 5,214,274 A | * | 5/1993 | Yang ....................... 250/208.1 |
| 5,847,594 A | | 12/1998 | Mizuno ....................... 327/514 |
| 6,069,377 A | | 5/2000 | Prentice et al. ............. 257/292 |

OTHER PUBLICATIONS

Yang, et al., A Nyquist–Rate Pixel–Level ADC for CMOS Image Sensors, IEEE Journal of Solid–State Circuits, vol. 34, No. 3, pp. 348–356 3/99.*
Fossum, CMOS Image Sensors: Electronic Camera–On–A–Chip, IEEE Transactions on Electron Devices, vol. 44, No. 10, pp. 1689–1697 10/97.*
Yadid–Pecht, Wide–dynamic–range sensors, Opt. Eng. 38(10) 1650–1660 10/99.*
Weckler, Operation of p–n Junction Photodetectors in a Photon Flux Integrating Mode, IEEE Journal of Solid–State Circuits, vol. SC–2, No. 3, pp. 65–73, 9/67.*
Yang, et al., A 128 × 128 pixel CMOS Area Image Sensor with Multiplexed Pixel Level A/D Conversion, Information Systems Laboratory, Standford University (No Date).*
El Gamal, Pixel Level Processing — Why, what, and How?, Information Systems Laboratory, Stanford University (No Date).*
Decker, et al., A 256 × 256 Imaging Array with Wide Dynamic Range Pixels and Column–Parallel Digital Output, IEEE Journal of Solid–State Circuits, vol. 33, No. 12, pp. 2081–2090 12/98.*
Kavadias, et al., A Logarithmic Response CMOS Image Sensor with on–Chip Calibration, IEEE Journal of Solid–State Circuits, vol. 35, No. 8, pp. 1146–1152 8/00.*
Yang, et al., A 640 × 512 CMOS Image Sensor with Ultrawide Dynamic Range Floating–Point Pixel–Level ADC, IEEE Journal of Solid–State Circuits, vol. 34, No. 12, pp. 1821–1834 12/99.*

* cited by examiner

Primary Examiner—Que T. Le
(74) Attorney, Agent, or Firm—W. Daniel Swayze, Jr.; W. James Brady; Frederick J. Telecky, Jr.

(57) ABSTRACT

A photodiode sensor (25) has a photodiode (30) with an associated capacitance (34), which may be a parasitic capacitance of the photodiode (30). A switch (36) is provided for charging the capacitance (34) to a predetermined reset voltage ($V_{reset}$), such that when light impinges upon the photodiode (30), the voltage on the capacitance (34) discharges in a time proportional to an intensity of the light. A circuit (42) is also provided for measuring the time for the capacitance (34) to discharge to a predetermined threshold value (33), which may be a function of time. The voltage on the output (38) of the comparator (28) may be sampled, with the sampling period also being variable as a function of time. The image may be reconstructed from time data indicating the relative times that discharge voltage of the pixels in an array cross the reference voltage (33).

30 Claims, 4 Drawing Sheets

| TIME SEQUENCE (SAMPLING INSTANT) | PIXEL NUMBER/ PIXEL VALUE | | | | | | | | | | | |
|---|---|---|---|---|---|---|---|---|---|---|---|---|
| | 1 | 2 | 3 | 4 | 5 | 6 | 7 | 8 | 9 | 10 | n-1 | n |
| 0 | 0 | 0 | 0 | 0 | 0 | 0 | 0 | 0 | 0 | 0 | 0 | 0 |
| 1 | 0 | 0 | 1 | 1 | 1 | 0 | 0 | 0 | 1 | 0 | 0 | 0 |
| 2 | 0 | 0 | 1 | 1 | 1 | 0 | 0 | 0 | 1 | 0 | 1 | 1 |
| $N_f$ | 0 | 0 | 1 | 1 | 1 | 0 | 0 | 0 | 1 | 0 | 1 | 1 |

TIME DOMAIN SENSING TECHNIQUE AND SYSTEM ARCHITECTURE FOR IMAGE SENSOR

CROSS REFERENCE TO RELATED APPLICATIONS

This application claims the benefit of prior filed copending provisional application serial No. 60/298,051, filed Jun. 13, 2001.

BACKGROUND OF INVENTION

1. Field of Invention

This invention relates to improvements in sensing circuits and techniques, and more particularly to improvements in CMOS photo sensing circuits and techniques.

2. Relevant Background

With advancing technology, digital still cameras (DSCs) are becoming increasingly popular, compared with traditional film cameras, in both industry and consumer imaging areas. Typically, the DSCs use one or more charge-coupled-devices (CCDs) to capture the desired light image. The CCDs used mostly in DSC systems, however, have a dynamic range of only about 60 to 70 dB. For most applications this dynamic range is insufficient, since light intensity variation, for instance, in most outdoor photographic scenes has a dynamic range in the order of 120 dB. This suggests a need for an image sensor with some kind of expanded dynamic range.

Many solutions to this problem have been suggested, including logarithmic sensors, multiple frame capture techniques and voltage-to-frequency conversion techniques. Logarithmic sensors incorporate compression at the photodiode level to achieve high dynamic ranges. However, these techniques suffer from the problem of high fixed-pattern noise being generated because of device mismatches. The voltage-to-frequency conversion techniques result in a complex pixel which has a large pixel size and low fill factor. It also suffers under low light conditions. The multiple frame capture techniques require a DSC system capturing multiple frames and use complex post-image processing to reconstruct a wide dynamic range image.

Figure 1:
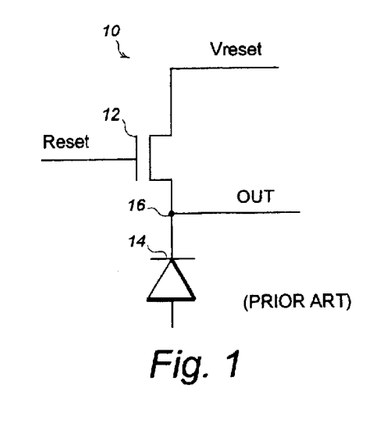
FIG. 1 is an electrical schematic diagram of a typical sensor architecture of the prior art.

A typical photodiode sensor architecture 10 is shown in FIG. 1, to which reference is first made. The parasitic photodiode capacitance (not shown) is initially charged by activating the reset transistor 12 to connect the photodiode 14 to a voltage source $V_{reset}$. When light impinges on the photodiode, charge carriers are generated. The resulting current discharges the photodiode node 16 and decreases the voltage on the photodiode as a function of time.

The relation between the voltage on the photodiode and the photo current I is given by:

$$I = C\frac{dV}{dt} \qquad (1)$$

$$\Delta V = \frac{I}{C} * \Delta t$$

where a $\Delta V$ is the photodiode voltage variation from the $V_{reset}$ level for a given integration time (or exposure time) $\Delta t$, and C is the capacitance seen at the photodiode node 16.

For a given integration time $\Delta t$ and constant C, equation (1) shows a linear relationship between $\Delta V$ and I. Once $\Delta V$ is measured at the end of the integration time, the photocurrent I (or alternatively the light intensity) can be calculated based on an I (or light intensity) and $\Delta V$ transfer function shown in FIG. 2, in which the transfer curve 18 is linear.

Figure 2:
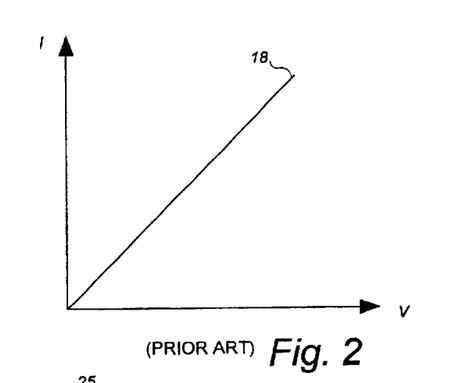
FIG. 2 is a graph of voltage vs. current to show a transfer function of a photodiode arrangement of the prior art.

Due to this simple linear transfer curve 18, most photodiode sensor systems integrate the charge for a particular period of time (or exposure time) and find the light intensity by measuring the photodiode voltage variation. But the fundamental problem behind these type schemes is in the integration time (or exposure time) selection. The photodiode voltage of a low intensity pixel decreases at a very slow rate, and therefore requires a large integration time to be detected with sufficient accuracy. On the other hand, a brightly illuminated pixel has a much higher voltage drop rate, and therefore requires the use of a short integration time to for detection before the photodiode enters saturation, at which time the measured voltage becomes constant. Hence, the light intensity dynamic range that could be detected by using a fixed integration time is limited.

One apparatus that has been proposed to improve the dynamic range for a semiconductor based image sensor generates a photodetector counter value for each pixel of the sensor. Each time the input of a comparator reaches a predetermined threshold value, a counter is incremented and the photodetector reset. At the end of the integration time for a frame capture, the counter value is read out via a digital output bus. The counter value therefore represents the number of times that the photodetector filled to the threshold level and was reset. In addition, the analog voltage of the photodetector is determined at the end of the integration time for a frame capture to represent the amount of charge collected since the photodetector was last reset. The total output value of the pixel at the end of the integration time for a frame capture is then the number of times the photodetector reached the programmed threshold value plus the analog voltage in the photodetector.

SUMMARY OF THE INVENTION

The method and apparatus of the present invention use a time domain quantization sensing (TDQS) system that digitizes a pixel analog value by quantizing it in the time domain. As can be seen from the discussion below, the system is implemented in a CMOS sensor system fabricated in a standard CMOS process, instead of a CCD process. A dynamic range of over 130 dB can be achieved in a single frame capture. Other advantages of the sensor include easily programmable resolution, digital FPN calibration, and low readout noise.

According to a broad aspect of the invention, a photodiode sensor is presented. The sensor includes means for providing a photodiode function, having an associated capacitance. The associated capacitance may be, for example, a parasitic capacitance of the means for providing a photodiode function. Means are provided for charging the associated capacitance to a predetermined reset voltage such that when light impinges upon the means for providing a photodiode function, the reset voltage discharges as a known function of time relatable to an intensity of the light. Means are also provided for measuring a time for the reset voltage to discharge to a predetermined threshold voltage to provide an indication of the intensity of the light. Preferably, the means for measuring a time for the reset voltage to discharge to a predetermined threshold voltage is a means for comparing a voltage on the associated capacitance to the predetermined threshold voltage, which may be time varying. The means for measuring a time for the reset voltage to discharge to a predetermined threshold voltage may be a means for sampling an output of the means for comparing a voltage on the associated capacitance at plurality of successive time periods, which also may be time varying.

According to another broad aspect of the invention, a photodiode sensor array is presented. The sensor array includes a plurality of photodiode sensors arranged in a predetermined physical array. Each photodiode sensor has a photodiode having a parasitic capacitance and means for charging the parasitic capacitance to a predetermined reset voltage, wherein when light impinges upon the photodiode, the parasitic capacitance discharges in proportion to an intensity of the light. Each sensor also has means for measuring a time for the reset voltage to discharge to a predetermined threshold value, wherein the time for the reset voltage to discharge to the predetermined threshold voltage indicates the intensity of the light.

According to another broad aspect of the inventions, a photodiode sensor array is presented, which includes a plurality of photodiodes arranged in a predetermined pattern, each having a respective associated capacitance. A circuit is provided for charging the associated capacitances to a predetermined reset voltage such that when light impinges upon the photodiodes, the associated capacitances each discharge in a time proportional to an intensity of the light respectively impingent thereupon. A circuit is also provided for measuring respective times for each of the associated capacitances to discharge to a predetermined threshold value, wherein relative intensities of the light respectively impingent upon each of the photodiodes can be determined.

According to yet another broad aspect of the invention, a method is presented for operating a photodiode sensor array. The method includes providing a plurality of photodiodes arranged in a predetermined pattern, each having a respective associated capacitance. The method also includes charging the associated capacitances to a predetermined reset voltage, and measuring respective times for each of the associated capacitances to discharge to a predetermined threshold value.

BRIEF DESCRIPTION OF DRAWINGS

The invention is illustrated in the accompanying drawing, in which.

herehereFIG. 9 is a schematic diagram of a partial implementation of a TDQS, in accordance with a preferred embodiment of the invention.

DETAILED DESCRIPTION

Figure 3:
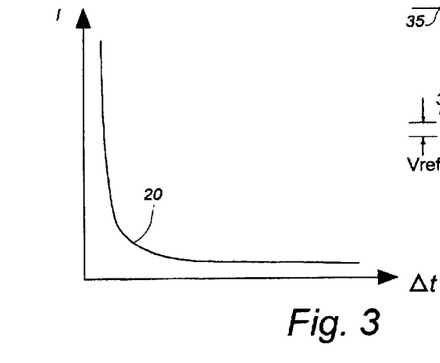
FIG. 3 is a graph of current vs. Δt to show a transfer function of a photodiode system for a given a ΔV and constant C, according to a preferred embodiment of the invention.

Analysis of Equation (1) reveals that there is another representation to describe the light sensing system. As shown in Equation (1), the voltage on the photodiode at any point of time is proportional to the current, and, in turn, to the intensity of the light impinged on the sensor. Therefore the time required for the sensor to reach a particular voltage level is inversely proportional to the intensity of light. For a given ΔV and constant C, the transfer function 20 of this representation is shown in FIG. 3.

The transfer function is nonlinear, thus its (I, Δt) representation is more complex than the standard linear case shown in FIG. 2. By comparing with FIG. 2, a large I value in this scheme, however, can be obtained with a small Δt measurement, while a large I value requires a large ΔV measurement in FIG. 2. Therefore, the (I, Δt) representation for the sensing system inherently has higher light dynamic range than the (I, ΔV) representation, due to a small limited value of ΔV in both CCD and CMOS sensor device.

Based on the introduction of the above (I, Δt) representation, we are now in position to detail our TDQS concept in which a light sensing measurement is performed in the time domain and the measurement value is digitized (or quantized) in the time domain.

Figure 4:
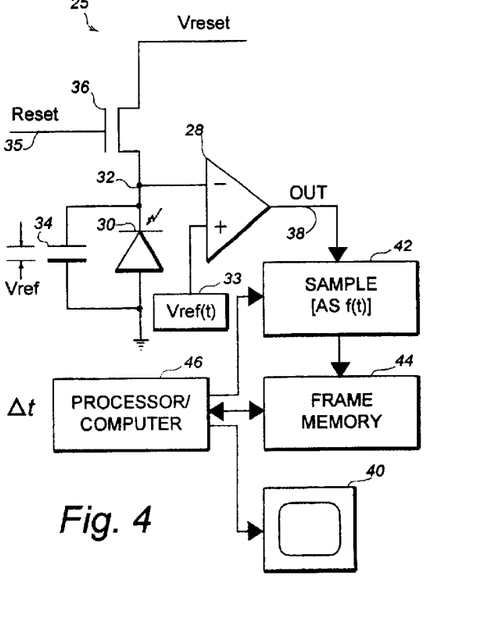
FIG. 4 shows a simplified TDQS architecture, according to a preferred embodiment of the invention, in which a comparator is provided with one input connected to the photodiode and other input connected to a reference signal $V_{ref}$.

FIG. 4 shows a simplified TDQS architecture 25, according to a preferred embodiment of the invention, illustrating the circuitry associated with one pixel of an array of image pixels. Typically, the array of image pixels, discussed in greater detail below, would include a plurality of such pixel circuits with their respective photodiodes 30 arranged in a predetermined physical pattern onto which light impinges and from which a final image is to be developed. The circuit 25 has a comparator 28 with its noninverting input connected to a photodiode 30 at node 32, and with its inverting input connected to a reference voltage $V_{ref}$ 33. As will become apparent below, the value of $V_{ref}$ may be established as a function of the value of the parasitic capacitance 34 associated with the photodiode 30 in order to differentiate the discharge times of the various other parasitic capacitances respectively associated with the other pixel photodiodes as well as a function of the maximum and minimum light intensity values to be images. In fact, as discussed below, $V_{ref}$ may itself be a time varying voltage to allow for limited frame times or to distinguish images having particularly high or low intensity values.

In operation, initially the parasitic photodiode capacitance 34 is charged to $V_{reset}$ by making the reset signal on line 35 high on the gate of transistor 36. $V_{reset}$ may be chosen so that the bulk effect of transistor 36 is minimal. A row select transistor (not shown) may be provided to control the output signal on output line 38 from the comparator 28. When light impinges on the photodiode 30, the generated photocurrent discharges the preestablished voltage on the parasitic capacitor 34. Assuming that the value for $V_{ref}$ 33 is chosen such that the variation in voltage across the parasitic capacitor 34 can be detected, the comparator 28 flips immediately after the voltage across the parasitic capacitor 34, $V_{ph}$, decreases below $V_{ref}$ 33. For a fixed reference voltage, $V_{ref}$, 33 the time taken for the output of the comparator 28 to toggle is inversely proportional to the discharging current, which, in turn, is directly proportional to the light intensity at that pixel.

This can be written as:

$$\Delta T \propto \frac{1}{I} \qquad (2)$$

where $\Delta T$ is the time difference between the starting time instant and the time instant at which the comparator toggle occurs. I is the photocurrent generated by light at the pixel. The proportionality constant in this case is the product of ($V_{reset}$–$V_{ref}$) and the parasitic capacitance 34 of the photodiode. This relationship is one-to-one; hence, the toggling time information can be easily mapped back to the intensity domain while reconstructing the image.

More particularly, the output of the comparator 28 is sampled by a sampling circuit 42 to detect the time at which the output of the comparator 28 has toggled. In the proposed TDQS system 25, nonuniform time sampling may be employed, as discussed below in detail. Adaptive time sampling techniques can also be employed by using data from the current or previous frame to optimize the choice of the sampling points for each particular scene. As will become apparent, the accuracy with which the toggling point is detected determines the accuracy of the measured light intensity. Each pixel outputs one digital bit on its respective output line 38 at each sampling instant. This is illustrated in FIG. 5 to which reference is now additionally made.

Figure 5:
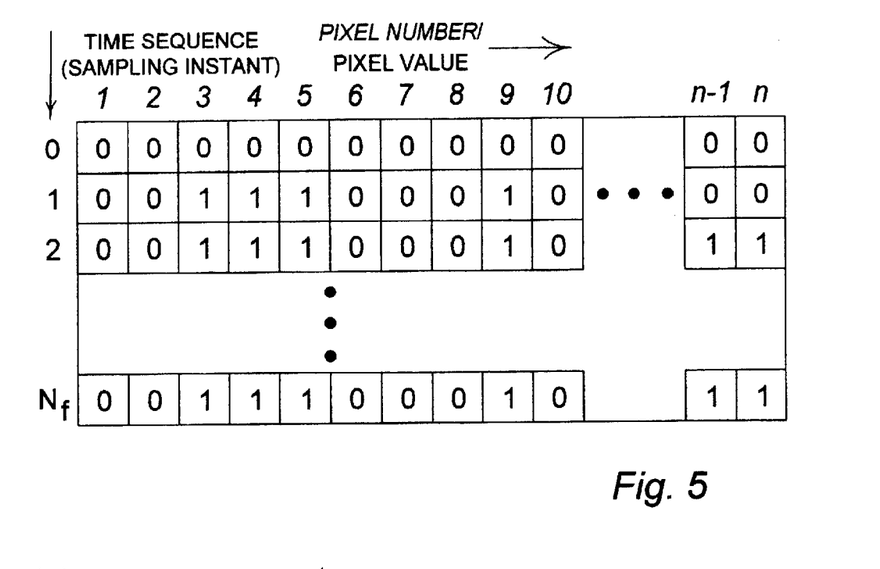
FIG. 5 is a table showing a number of time sequences separated by known time differences vs. pixel number and respective pixel values at corresponding time sequences in accordance with a preferred embodiment of the invention.

FIG. 5 is a table showing a number of time sequences, 0, 1, 2, . . . $N_p$, each separated by a known time difference, scaled vertically on the left side of the table vs. the pixel number, 1, 2, . . . n, with their respective values at corresponding time sequences along the horizontal axis. The pixel numbers are shown at the top of the table. Thus, at each sampling instant, the array of pixels outputs a "subframe" or "sample frame" of digital bits. Each subframe contains the information indicating for each pixel whether the comparator of the pixel has toggled. Since the time between each sampling instant is known, this information may be used to reconstruct the final image frame.

In the embodiment illustrated, each sample frame is indexed and the sampling time instants are related to this index. The index is referred to herein as the "sampling order". Thus, the sampling order may be used to distinguish the sampling time instants. Therefore, for example, depending on the intensity of the light at a particular pixel, the bit corresponding to that pixel in the sample frame gets toggled at a particular sampling instant. The toggling information at each sampling instant can be stored in a table, as illustrated by the table of FIG. 5. For example, at time instant (sample instant), or for a particular time index (sample order) number 1, pixels 3, 4, 5, and 9 are shown to have been toggled.

Different pixels in the image array toggle at different sampling instants depending on the respective light intensities to which they have been subjected. Consequently, the various intensities can be identified using their corresponding sampling orders. The sampling order associated with each pixel contains the light intensity information at that pixel, and, therefore, the subframes may be may be stored in a frame memory 44 and used to reconstruct the final image. The final image frame may be constructed from calculations based on the time information contained in the various subframes, for example, using an appropriately programmed computer 46 and printed or displayed on a display 40.

One advantage of the TDQS architecture 25 over previous wide dynamic range techniques can be understood by observing that the pixel output is digital but is not an exact digital representation of the entire analog signal produced on the cathode of the photodiode 30. This analog output is quantized in the time domain, and is mapped to a particular point on the time axis. This time point, if detected accurately, can be mapped back either to the analog representation, or can be used to construct the exact digital representation. It can be seen that a very high intensity signal may be mapped to a point very close to zero and a low intensity signal maybe mapped to a point that is farther out in time. The highest intensity that could be detected with this architecture is determined by the time taken by the comparator to make a correct decision. In other words, the higher part of the dynamic range is determined by the settling time of the comparator. It is to be noted that the highest intensity that could be detected is independent of the time taken to read out the whole image sensor array. But the read-out time due to the settling time of the comparator limits the resolution with which the net highest intensity can be detected. This read-out time depends on details of implementation of circuit/hardware design architecture and pixel array size, but can be made quite short, for example, on the order of about 10 ns.

Figure 6:
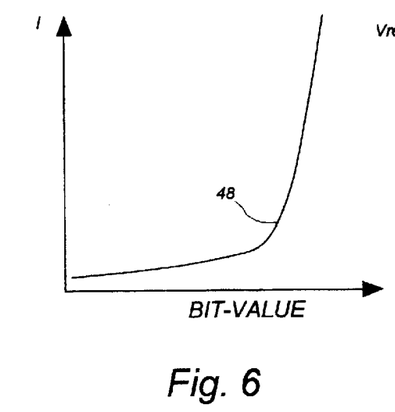
FIG. 6 is a graph of light intensity vs. the number of bits in the time domain of a pixel detector system constructed in accordance with a preferred embodiment of the invention.

Based on the nonlinear transfer function 48 of FIG. 3, light intensity vs. the number of bits in the time domain can be graphed, as shown in FIG. 6, to which reference is now additionally made. As seen in FIG. 6, for a constant sampling architecture system, a low light intensity slowly increases with lower bit-values and a strong light intensity increases rapidly with higher bit values. Since the TDQS sampling is performed on an analog signal produced on the cathode of the photodiode 30, each bit of the system responds to a different analog signal or different light intensity. In other words, the lower bit-value gives more details of low light condition or more intensity resolution at low light end.

In the case of a sensor array, the above constant sampling architecture suggests that oversampling may be beneficial at low-light pixels if the system requires a short sampling time for high-light pixels. It can also be seen that the constant sampling architecture may also require a large memory for high bit code values in order to retain a wide light dynamic range.

As mentioned above, the voltage $V_{ref}$ 33 may be time varying. More particularly, from the discussion above, it is clear that the reference voltage applied to the comparator 28 plays a major role in determining the dynamic range of the sensor. Given a fixed integration time, it would be required that the reference voltage be close enough to the reset voltage to make the lowest intensity pixel in the image result in a toggled output. On the other hand the reference voltage should be sufficiently below the reset voltage to ensure that the brightest pixel does not toggle too fast. A low reference voltage also helps in obtaining a better resolution for brighter intensities.

The problem can be better understood by looking closely at the constant reference voltage scheme. From Equation 2, it can be observed that for a fixed reference voltage, the toggling time is inversely proportional to the intensity of the light. Consider a case in which the required photocurrent resolution at all points of time is $I_{lsb}$, in other words, for two pixels with photocurrents I1 and I2, the difference between I1 and I2 is required to be at least $I_{lsb}$. The difference between the toggling points of these two pixels would be given by:

$$(\Delta T_1 - \Delta T_2) = c(V_{reset} - V_{ref}) * \left(\frac{I_{LSB}}{I_1 * I_2}\right) \quad (3)$$

Hence, the difference in toggling points is inversely proportional to the values of the photocurrents produced in the two pixels. For small photocurrents, the difference between the toggling points is high and for large photocurrents, the difference between the toggle points is small. Hence, a constant sampling time is used to sample the image, oversampling results at low intensities. The additional information available from the oversampling may or may not be useful, depending on the system needs and display resolution. If desired, the oversampling could be avoided in two ways. One way is to adapt the sampling time such that the sampling period is small at high resolutions and is high at low resolutions. The other way to avoid oversampling is to change the reference voltage as a function of time and force the low intensity pixels to toggle earlier than they actually should. Both ways, of course, can be concurrently employed. Both functions can easily be represented in the digital domain, and expressed by:

$$V_{reference}(n) = \begin{cases} V_0 & \text{for } n = 1 \ldots m \text{ and} \\ V_0 + (n-m)\frac{V_0}{k} & \text{for } n > m \end{cases} \quad (4)$$

where n is the sampling order or sampling frame index.

Figure 7:
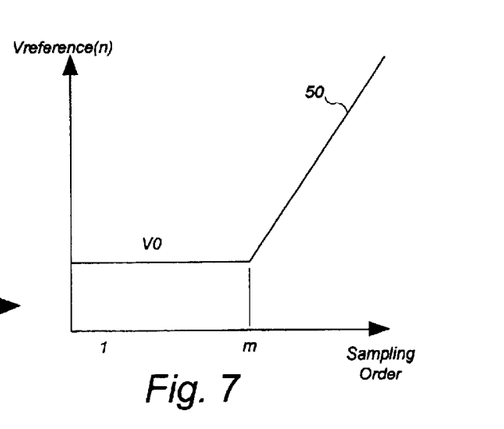
FIG. 7 is a graph of $V_{reference}$ vs. sampling order according to Equation (4) set forth below, in accordance with a preferred embodiment of the invention.

The equation as a function of n 50 is shown in FIG. 7 to which reference is now additionally made. It can be seen that the function 50 results in a constant reference voltage for sample frames 1 to m and increases as a ramp beyond the sample frame m. The sample m corresponds to the frame at which the transition from a constant reference voltage, $V_0$, to a ramping reference voltage starts. The value of m could be chosen depending on the resolution required at low intensities. The factor k, which is an integer, determines the slope of the ramp. As explained below, reset voltage should be a function of the reference voltage, $V_0$. The common mode voltage swing of the comparator determines the minimum reference voltage that could be used in the circuit. There is no limit on the maximum reference voltage that could be used but having a reference voltage that is above the reset voltage makes all the dark pixels toggle and hence does not convey any information. It is important to reiterate that any monotonically increasing function suits the architecture, and the kind of function to be used is determined by implementation and image reconstruction considerations.

Figure 8:
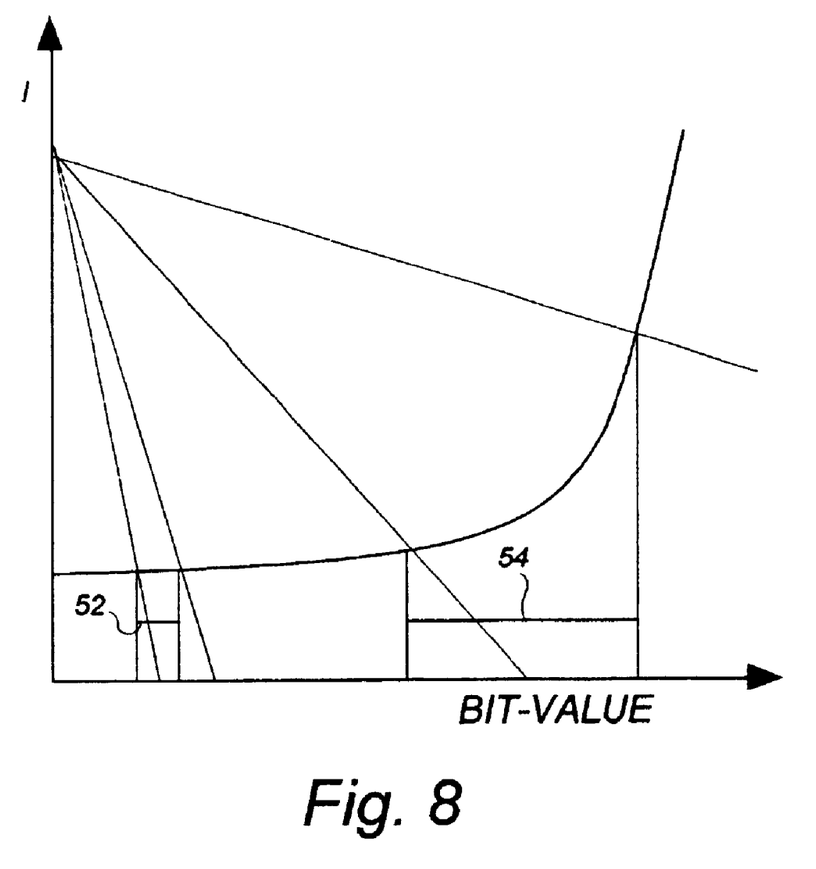
FIG. 8 is a graph showing the variation in the toggling time differences and between two pixels separated by the same intensity difference as a function of time when the reference voltage is increased as an exponential function, in accordance with a preferred embodiment of the invention.

As explained above, brightly illuminated pixels require that the sampling be fast and that the sampling period be short. On the other hand, low light pixels do not change much in a very short time interval. Constant sampling results in oversampling at low intensities, and affects not only the power dissipation in the circuit, but also results in large memory requirements. The oversampling may be reduced to an extent by varying the reference voltage as a function of time. But the problem may not be solved completely by a time-varying reference voltage. As an illustration, FIG. 8 shows the variation in the toggling time differences 52 and 54 between two pixels separated by the same intensity difference as a function of time when the reference voltage is increased as an exponential function. This problem becomes important because it is difficult to determine and implement a reference voltage function that exactly cancels out the non-linearity. In this technique, the frequency at which the comparator outputs are sampled is dynamically varied. Equation 3 shows that an exponential increase of sampling period is a good fit for the application. But digital image reconstruction requires that the function be easily be representable in the digital domain.

According to the present invention, a function whose sampling period is constant for a fixed number of sample frames and increases as a ramp for the sample frames beyond that is used. In other words, the sampling time is initially increased in a linear fashion and is increased as a square fashion in later sample frames, according to the following equations:

$$T_{samplingperiod} = T_{n+1} - T_n = (n+1)k$$
$$\Rightarrow T_{n+1} = T_n + (n+1)k$$
$$T_{n+1} = T_0 + \left(\frac{(n+1)(n+2)}{2}\right)k$$

In the above equation, $T_{samplingperiod}$ denotes the sampling instant, k denotes the slope at which the sampling period is increased and n denotes the sampling order.

If $T_0$ is the origin:

$$T_n \propto n^2 \quad (5)$$

then the function could mathematically be expressed as:

$$T_{samplingperiod} = K_1 \quad \text{for } n = 1 \ldots m$$
$$= (K_2 * n) + K_1 \quad \text{for } n = m \ldots N_{total}$$

where $T_{samplingperiod}$ is the sampling period, n is the sample order, $K_1$ is the initial voltage and $K_2$ is a constant that determines the slope of the slope of the ramp. This equation could be expressed in terms in terms of the sampling time instants instead of sampling period. By using Equation (5), the equation for sampling time instants can be recognized as:

$$\begin{cases} T(n) = (n * T_s) + (c * T_s) & \text{for } n = 1 \ldots m \\ = \left(\frac{(n-m)^2}{c_1} + n\right) * T_s + (c * T_s) & \text{for } n = m \ldots N_{total} \end{cases} \quad (6)$$

where $T_s$ and $c_1$ are defined by the boundary conditions of the sampling times. c is an integer constant that takes care of a constant time offset before the first sample frame is captured. Since the image is reconstructed in the digital domain, there are some restrictions on the use of the above function. The restrictions are that the last sampling time instant be an integer multiple of the first sampling instant. This could be expressed as:

$$\frac{(N_{total} - m)^2}{c_1} + N_{total} = p$$

where p is any integer and $N_{total}$ is the sample order of the final frame. By applying the boundary conditions, the equation for the sampling time can be shown to be:

$$\left\{\begin{array}{ll} T(n) = (n*T_s) + (c*T_s) & \text{for } n = 1 \ldots m \\ = \left(\dfrac{(n-m)^2 * (p - N_{total})}{(N_{total} - m)^2} + n\right) * T_s + c*T_s & \text{for } n = m \ldots N_{total} \end{array}\right\}$$

The time-varying sampling time coupled with the time-varying reference voltage determines the resolution obtained at different intensities. It should also be noted that the mathematical functions that determine the sampling instants can easily be changed, depending on the resolution and the dynamic range requirements.

According to another preferred embodiment of the invention, a digital representation with a varying bit-step value is presented. The bit-step is defined as the difference between two consecutive digital values. According to the invention, the bit-step is made small for low intensities (fine resolution) and is large for bright light conditions (course resolution). In the current TDQS architecture since the low intensity pixels toggle much later than the bright intensity pixels, the bit-step variation could be made a function of time. The equation governing the bit-step variation could easily be derived while considering the variation in the reference voltage and the sampling period as a function of the sampling order.

In the TDQS architecture of the invention, if the intensity is varying as a continuous function over the image, every new sample-frame contains information about a different intensity. Hence, every sampling order uniquely identifies a light intensity value. Therefore, the bit-step in terms of normalized photocurrent, normalized with respect to capacitance, is given by the difference in the normalized photocurrents generated by two consecutive sample frames. This is given by:

$$\text{Bit step}(n+1) = \left[\left(\dfrac{V_{reset} - V_{ref}(n)}{T_{sampling}(n)}\right) - \left(\dfrac{V_{reset} - V_{ref}(n+1)}{T_{sampling}(n+1)}\right)\right]$$

where Bit-step(n+1) is the bit-step at the $(n+1)^{th}$ sampling instant, $V_{reset}$ is the reset voltage, $V_{ref}(n)$ is the comparator reference voltage at the n sampling instant, $V_{ref}(n+1)$ is the comparator reference voltage at the $(n+1)^{th}$ instant, $T_{sampling}(n)$ is the sampling time of the $n^{th}$ Sample-frame, and $T_{sampling}(n+1)$ is the sampling time of the $(n+1)^{th}$ sample-frame. The basic difference between this representation and the conventional digital representation is that the bit-step, in this case, is not constant over time. It can be seen that this new bit representation results in a bit-step that is high for high intensities and low for low intensities. This is similar to the way an image is perceived by a human eye, and hence is a more useful representation for the application. Though the derivation of the current representation is focused on TDQS architecture, the idea could be extended for other dynamic ranges.

Figure 9:
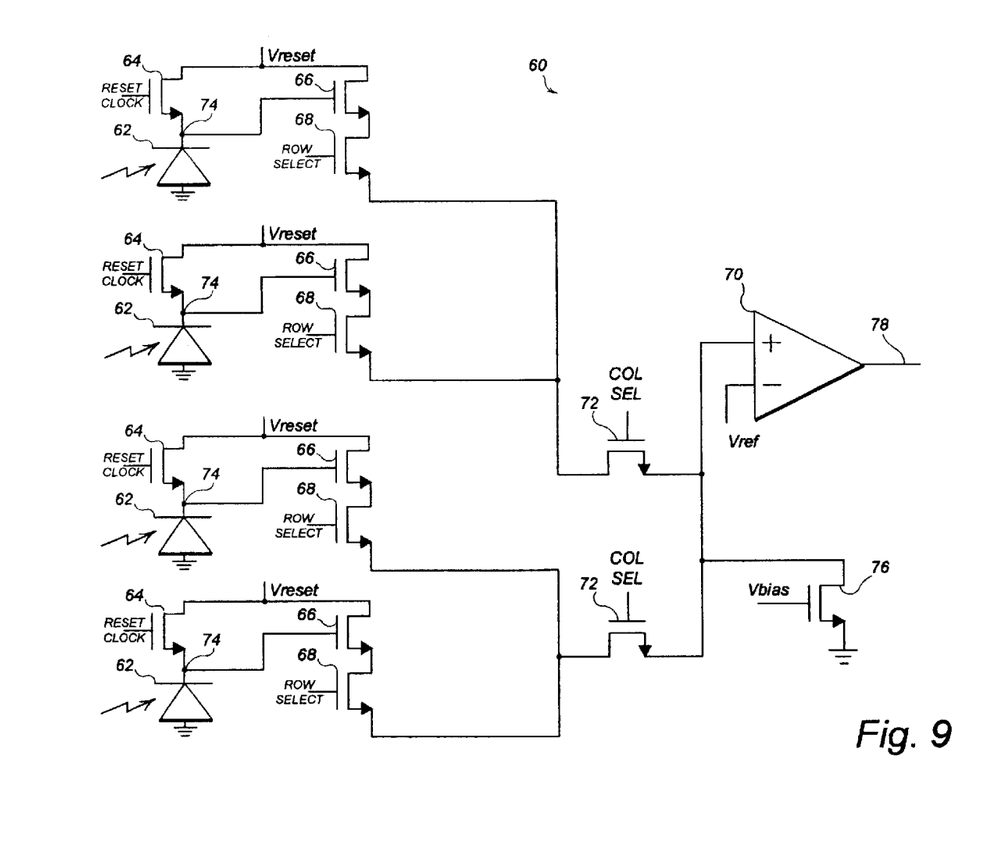

A schematic diagram of a partial implementation of a TDQS 60 is shown in FIG. 9, to which reference is now additionally made. Each pixel is substantially identical, and, therefore, is identified by respective similar reference numerals. Each pixel in the sensor has a reset transistor 64, a source follower transistor 66, a select transistor 68, and a photodiode 62. To improve the fill factor, one comparator 70 is shared between four pixels using a multiplexing logic. The multiplexer consists of the four select transistors 68 and two column-select transistors 72. It should be noted at this juncture that the photodiode outputs 74 could directly be connected to the comparator 70 through select transistors, if desired, in some applications. However such connections would result in a charge sharing between the parasitic capacitances of the photodiodes and the comparator input capacitance when the switch is the ON condition. Also, the switches in the pixel cause charge injection corrupting the voltage signal present on the photodiode capacitance. Since this voltage is sampled multiple times, the charge injection may result in temporal noise in the circuit. The photodiode node 74 has a high impedance and, hence, is susceptible to any noise appearing at that node. To avoid these problems the architecture shown in FIG. 9 is preferred.

The time-varying sampling time coupled with the time-varying reference voltage determines the resolution obtained at different intensities Again it is noted that the mathematical functions that determine the sampling instants could be changed depending on the resolution and the dynamic range requirements. The reset transistor 64 and the analog friendly source follower transistor 66 are used in the design to attain a better voltage swing at the photodiode node 74. The bias for the source follower is set by the analog-friendly bias transistor 76.

As mentioned, to improve the fill-factor of the pixels, one comparator 70 is shared between pixels. The pixel outputs are multiplied one after another onto the noninverting input of the comparator 70. Multiplexing is done using a row select switch 68 that is internal to each pixel and two column-select switches 72 common to the four pixels sharing the comparator 70. The column select signal multiplexes the two consecutive columns that share the comparator 70. The multiplexes logic also helps in minimizing the static power dissipation. Note that the bias transistor 76 is also shared between the four pixels. When a pixel is selected to be read out, the row select transistors 68 and the column select transistors 72 of that pixel are turned ON. Since the bias circuit is connected to the pixel after the select switches, the bias is ON only when one of the four pixels is selected. It can be seen that the bias transistor could actually be made common to one complete column of pixels, but may result in adverse settling considerations and column read-out FPN noise. In such a situation, the pixel source follower transistor 66 has to drive the entire column capacitance.

It is important to note that the switching digital noise in the TDQS architecture may be higher than the digital noise in APS and hence the FPN performance of the architecture, as a whole, is dependent on which term is more dominant. The outputs of all the comparators 70 present in the same column are connected together and are provided as an input to a sense amplifier buffer (not shown). When the row select transistor 68 is turned on, the output of the comparator 70 appears on the column line 78.

The buffer senses the digital level of the output of the comparator and provides a fully quantized digital output. This output is allowed to settle to a full digital value and is latched by triggering the clock input of a latch connected to the output of the buffer. Since, pixels in two consecutive columns share the same comparator and the same column line, the number of latches required is half the number of columns. Since the comparators in the same row make a decision simultaneously, all the latches have to be clocked at the same time. If the number of columns in the image array is N, N/2 outputs are obtained simultaneously. These outputs have to be sent out of the chip before the next latch clock. These outputs are sent out in a partially parallel fashion using a multiplexer. A typical chip may have 16 output pins. Hence N/32 consecutive latches may be connected to the same multiplexer. The multiplexer multiplexes one of the N/32 inputs onto one output pin. The advantage if this architecture is a reduction in the chip-level data output rate.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A photodiode sensor, comprising:
   means for providing a photodiode function, having an associated capacitance;
   means for charging said associated capacitance to a predetermined reset voltage, wherein when light impinges upon said means for providing a photodiode function, said reset voltage discharges as a known function of time relatable to an intensity of said light;
   and means for measuring a time for the reset voltage to discharge to a predetermined threshold voltage to provide an indication of said intensity of said light.

2. The photodiode sensor of claim 1 wherein said associated capacitance is a parasitic capacitance of said means for providing a photodiode function.

3. The photodiode sensor of claim 1 wherein said means for charging said associated capacitance comprises a transistor for selectively connecting said means for providing a photodiode function to a predetermined supply voltage.

4. The photodiode sensor of claim 1 wherein said means for measuring a time for said reset voltage to discharge to a predetermined threshold voltage comprises:
   means for comparing a voltage on said associated capacitance to said predetermined threshold voltage.

5. The photodiode sensor of claim 4 wherein said means for measuring a time for said reset voltage to discharge to a predetermined threshold voltage comprises means for sampling an output of said means for comparing a voltage on said associated capacitance at plurality of successive time periods.

6. The photodiode sensor of claim 5 wherein said sampling time periods of said means for sampling are not constant.

7. The photodiode sensor of claim 6 wherein said sampling time periods are small at high resolutions and high at low resolutions.

8. A photodiode sensor array, comprising:
   a plurality of photodiode sensors arranged in a predetermined physical array, each photodiode sensor comprising:
     a photodiode having a parasitic capacitance;
     means for charging said parasitic capacitance to a predetermined reset voltage, wherein when light impinges upon said photodiode, said parasitic capacitance discharges in proportion to an intensity of said light;
     and means for measuring a time for said reset voltage to discharge to a predetermined threshold value, wherein said time for said reset voltage to discharge to said predetermined threshold voltage indicates said intensity of said light,
   and further comprising means for selectively accessing each of said photodiode sensors to read said times for said parasitic capacitances to discharge to said predetermined threshold voltage.

9. The photodiode sensor array of claim 8 wherein said means for measuring a time for said reset voltage to discharge to a predetermined threshold value comprises:
   means for comparing a voltage on said parasitic capacitance to said predetermined threshold voltage.

10. The photodiode sensor array of claim 8 wherein said means for charging said parasitic capacitance comprises a transistor for selectively connecting said photodiode to a predetermined supply voltage.

11. The photodiode sensor of claim 9 wherein said means for measuring a time for said reset voltage to discharge to a predetermined threshold voltage comprises means for sampling an output of said means for comparing a voltage on said parasitic capacitance at plurality of successive time periods.

12. The photodiode sensor array of claim 11 wherein sampling times of said means for sampling are not constant.

13. The photodiode sensor array of claim 12 wherein said sampling times are small at high resolutions and high at low resolutions.

14. A photodiode sensor array, comprising:
   a plurality of photodiodes arranged in a predetermined pattern, each having a respective associated capacitance;
   a circuit for charging said associated capacitances to a predetermined reset voltage, wherein when light impinges upon said photodiodes, said associated capacitances each discharge in a time proportional to an intensity of said light respectively impingent thereupon;
   and a circuit for measuring respective times for each of said associated capacitances to discharge to a predetermined threshold value, wherein relative intensities of said light respectively impingent upon each of said photodiodes can be determined.

15. The photodiode sensor array of claim 14 wherein said associated capacitance is a parasitic capacitance.

16. The photodiode sensor array of claim 14 further comprising circuitry for varying said predetermined threshold value as a function of time.

17. The photodiode sensor array of claim 16 wherein said circuitry for varying said predetermined threshold value as a function of time comprises circuitry to provide a reference voltage sufficiently close to said reset voltage to make a lowest intensity pixel in the image result in a toggled output and sufficiently below said reset voltage to ensure that the brightest pixel does not toggle too fast.

18. The photodiode sensor array of claim 14 wherein said means for measuring a time for said associated capacitance to discharge to a predetermined threshold value comprises a comparator for comparing a voltage on said parasitic capacitance to said predetermined threshold voltage.

19. The photodiode sensor array of claim 14 wherein said circuit for charging said associated capacitance comprises a transistor for selectively connecting said photodiode to a predetermined supply voltage.

20. The photodiode sensor array of claim 14 wherein said circuit for measuring a time for said associated capacitance to discharge to a predetermined threshold value comprises a sampling circuit and a circuit for comparing a voltage on said associated capacitance at plurality of successive sampling time periods to said reference voltage.

21. The photodiode sensor array of claim 20 wherein sampling time periods vary as a function of time.

22. The photodiode sensor array of claim 21 wherein said sampling times are small at high resolutions and high at low resolutions.

23. A method for operating a photodiode sensor array, comprising:

providing a plurality of photodiodes arranged in a predetermined pattern, each having a respective associated capacitance;

charging said associated capacitances to a predetermined reset voltage;

and measuring respective times for each of said associated capacitances to discharge to a predetermined threshold value.

24. The method of claim 23 further comprising varying said predetermined threshold value as a function of time.

25. The method of claim 24 wherein said varying said predetermined threshold value as a function of time comprises providing a reference voltage close enough to said reset voltage to make a lowest intensity pixel in the image result in a toggled output and sufficiently below said reset voltage to ensure that the brightest pixel does not toggle too fast.

26. The method of claim 23 wherein said measuring a time for said associated capacitance to discharge to a predetermined threshold value comprises comparing a voltage on said associated capacitance to said predetermined threshold voltage.

27. The method of claim 23 wherein said charging said associated capacitance comprises selectively connecting said photodiode to a predetermined supply voltage.

28. The method of claim 23 wherein said measuring a time for said associated capacitance to discharge to a predetermined threshold value comprises sampling voltage values on said associated capacitance and comparing said sampled voltages at plurality of successive sampling time periods to said reference voltage.

29. The method of claim 28 further comprising varying said sampling time periods vary as a function of time.

30. The method of claim 29 wherein varying further comprises varying said sampling times a small amount at high resolutions and a high amount at low resolutions.

* * * * *